United States Patent
Gauthier et al.

(10) Patent No.: US 7,054,787 B2
(45) Date of Patent: May 30, 2006

(54) EMBEDDED INTEGRATED CIRCUIT AGING SENSOR SYSTEM

(75) Inventors: Claude R. Gauthier, Cupertino, CA (US); Pradeep R. Trivedi, Sunnyvale, CA (US); Gin S. Yee, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 66 days.

(21) Appl. No.: 10/349,854

(22) Filed: Jan. 23, 2003

(65) Prior Publication Data

US 2004/0148111 A1    Jul. 29, 2004

(51) Int. Cl.
*G06F 11/00* (2006.01)

(52) U.S. Cl. ............................. 702/183; 438/17
(58) Field of Classification Search ............ 702/57, 702/64–65, 75, 117–120, 123, 183; 324/763–764; 438/17–18; 327/408

See application file for complete search history.

(56) References Cited

U.S. PATENT DOCUMENTS

| | | | | |
|---|---|---|---|---|
| 5,451,881 | A * | 9/1995 | Finger | 324/433 |
| 5,998,980 | A * | 12/1999 | Schieke et al. | 323/276 |
| 6,035,265 | A * | 3/2000 | Dister et al. | 702/183 |
| 6,476,663 | B1 | 11/2002 | Gauthier et al. | 327/513 |
| 6,629,638 | B1 * | 10/2003 | Sanchez | 235/454 |
| 6,650,103 | B1 * | 11/2003 | Righter | 324/117 H |
| 6,687,635 | B1 * | 2/2004 | Horne et al. | 702/86 |
| 6,700,802 | B1 * | 3/2004 | Ulinski et al. | 363/37 |
| 2003/0177380 | A1 * | 9/2003 | Woods | 713/200 |
| 2003/0184307 | A1 * | 10/2003 | Kozlowski et al. | 324/427 |

* cited by examiner

*Primary Examiner*—Marc S. Hoff
*Assistant Examiner*—Mary Catherine Baran
(74) *Attorney, Agent, or Firm*—Osha Liang LLP

(57) ABSTRACT

A method and apparatus for sensing an aging effect on an integrated circuit using a sensor disposed on the integrated circuit and arranged to generate an output dependent on a condition of an element within the sensor. A processor operatively connected to the sensor is arranged to indicate a code dependent the output.

25 Claims, 8 Drawing Sheets

EMBEDDED INTEGRATED CIRCUIT AGING SENSOR SYSTEM

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (ICs) (16) that have various functionalities, and communication paths (18), i.e., buses and wires, that are necessary for the transfer of data among the aforementioned components of the computer system (10).

Circuit elements in a microprocessor (12), and more generally, an IC (16), continue to get smaller. Accordingly, more and more circuit elements may be packed into an IC (16). In FIG. 2, a cross sectional diagram of a particular type of circuit element, a p-channel transistor (200), is shown. The p-channel transistor (200) includes two n+ regions (204, 206) implanted in a p-substrate (210) or a p-well. The two n+ regions (204, 206) form a drain and source region for the p-channel transistor (200). The depth of the drain and source regions may determine a junction (209) thickness for current to flow from one n+ region (204 or 206), through a channel formed below a gate (202) when the transistor (200) is "on," to the other n+ region (206 or 204). A source contact (212) and drain contact (214) allow a connection with the n+ regions (204, 206), respectively. The p-channel transistor (200) is separated from other devices by a field oxide (230, 232).

The p-channel transistor (200) is controlled by a voltage potential on a gate (202). A gate contact (216) allows a connection with the gate (202). The gate (202) is separated from the p-substrate (210) by a gate oxide (208).

A voltage potential difference between the source contact (212) and drain contact (214) is denoted $V_{ds}$. A voltage potential difference between the gate contact (216) and the source contact (212) is denoted $V_{gs}$. The voltage potential to turn the p-channel transistor (200) "on," i.e., allow the p-channel transistor (200) to conduct current, is a threshold voltage potential denoted $V_t$.

FIG. 3 shows a diagram of a current-voltage characteristic for a typical metal-oxide transistor. As shown in FIG. 3, the p-channel transistor (200 shown in FIG. 2) is "off" when $|V_{gs}|<|V_t|$ (255). The p-channel transistor (200 shown in FIG. 2) is "on" and in a linear region of operation when $|V_{ds}|\leq|V_{gs}-V_t|$ and $|V_{gs}|\geq|V_t|$ (265). The p-channel transistor (200 shown in FIG. 2) is "on" and in a saturation region of operation when $|V_{ds}|>|V_{gs}-V_t|$ and $|V_{gs}|\geq|V_t|$ (27

As circuit elements in an IC (16 shown in FIG. 1) continue to get smaller, features of the circuit elements, e.g., the gate oxide thickness, the depth of the two n+ regions (204, 206 shown in FIG. 2), the spacing between the two n+ regions (204, 206 shown in FIG. 2), etc., get smaller.

SUMMARY OF INVENTION

According to one aspect of the present invention, an integrated circuit comprising a first sensor disposed on the integrated circuit and arranged to generate a first output dependent on an aging effect of a first element within the first sensor; and a processor operatively connected to the first sensor and arranged to indicate a code dependent on the first output.

According to one aspect of the present invention, a method for determining an aging effect on an integrated circuit comprising generating a first output dependent on a condition of a first element; and indicating a code dependent on the generating where the code is indicative of the aging effect.

According to one aspect of the present invention, an integrated circuit comprising means for generating an output dependent on a condition of an element; and means for indicating a code dependent on the output where the means for indicating is indicative of an aging effect.

Other aspects and advantages of the invention will be apparent from the following description and the appended claims.

DETAILED DESCRIPTION

Figure 1:
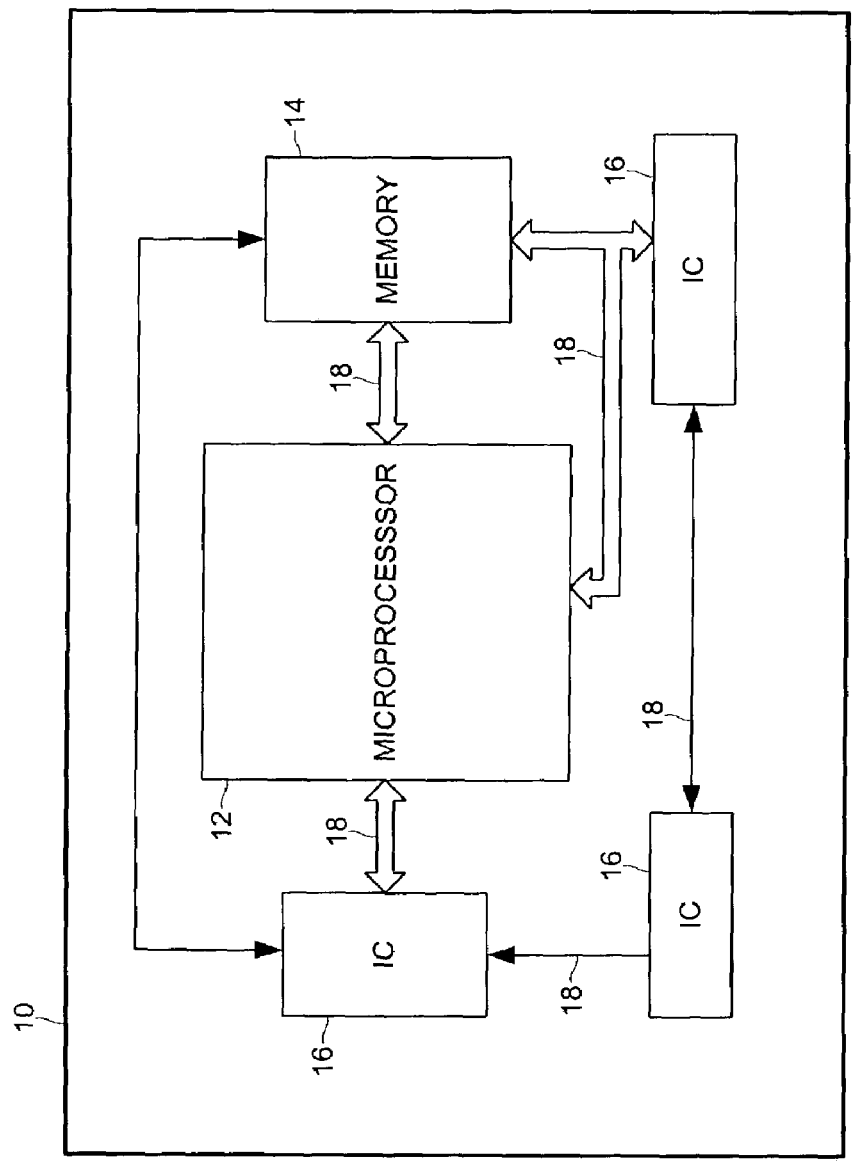
FIG. 1 shows a diagram of a typical computer system.

Embodiments of the present invention relate to a method and apparatus for sensing aging effects and reporting the effects to other circuits. Accordingly, the other circuits may make adjustments based on the reporting so that the circuits continue to operate as expected. Like elements in various figures are denoted by like reference numerals throughout the figures for consistency.

Figure 2:
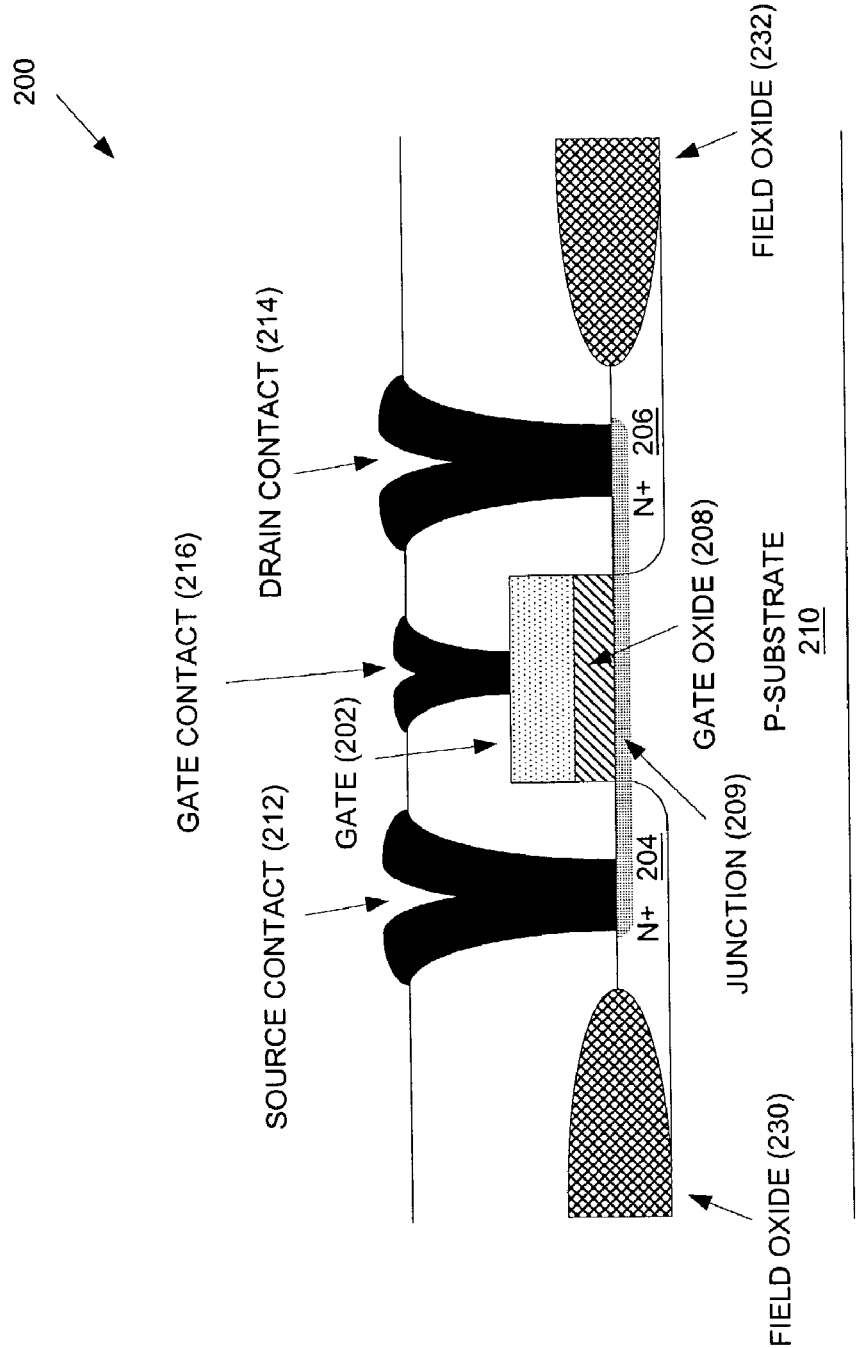
FIG. 2 shows a cross sectional diagram of a typical p-channel transistor.
Figure 3:
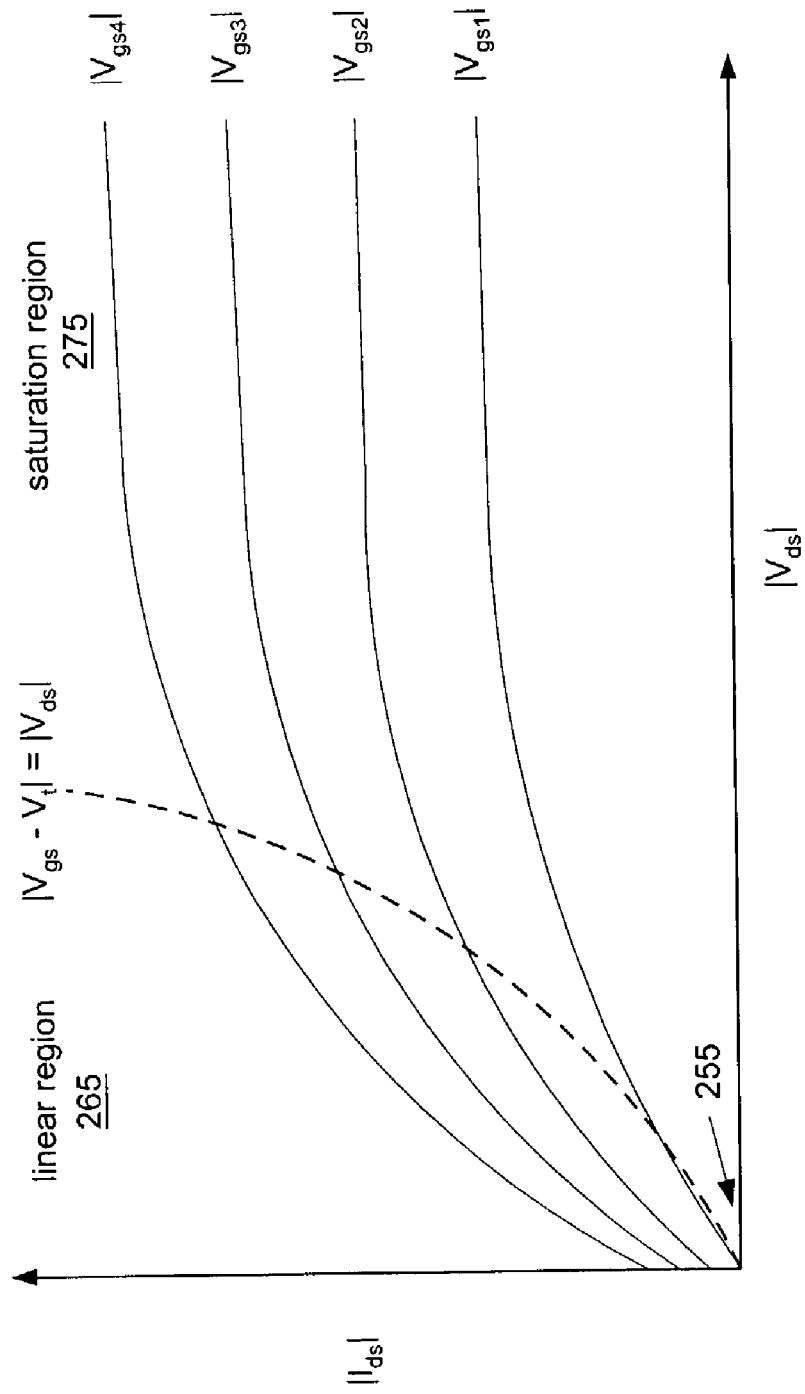
FIG. 3 shows a diagram of current-voltage characteristic for a typical metal-oxide transistor.

As circuit elements (i.e., n-channel and/or p-channel transistors) in an IC (e.g., 16 shown in FIG. 1) continue to get smaller, one effect is that the gate oxide thickness (208 shown in FIG. 2) becomes thinner. The thin gate oxide thickness may cause a threshold voltage potential to vary, or "age," over time. As a transistor ages with time, the threshold voltage potential of the transistor may increase. Accordingly, aging of a transistor may affect critical circuits, thereby adversely impacting IC performance.

Also, as circuit elements (i.e., transistors) get smaller, a channel formed for conduction of current between the n+ regions (204, 206 shown in FIG. 2) may have a junction (209) thickness that is thinner relative to prior generation transistors. Furthermore, a depth of the two n+ regions (204, 206 shown in FIG. 2) implanted in a p-substrate (210 shown in FIG. 2) or a p-well may cause a junction (209) thickness that is thinner relative to prior generation transistors. Similarly, n-channel transistors may have a thin junction thickness. A thin junction (209) thickness formed by the channel and shallower implant regions (to form a source and drain region of a transistor) may cause a transistor to "age" over time. Aging may affect one or more operational characteristics of a transistor as time elapses from when the transistor was manufactured. Accordingly, aging of a transistor may affect critical circuits, thereby adversely impacting IC performance.

Figure 4:
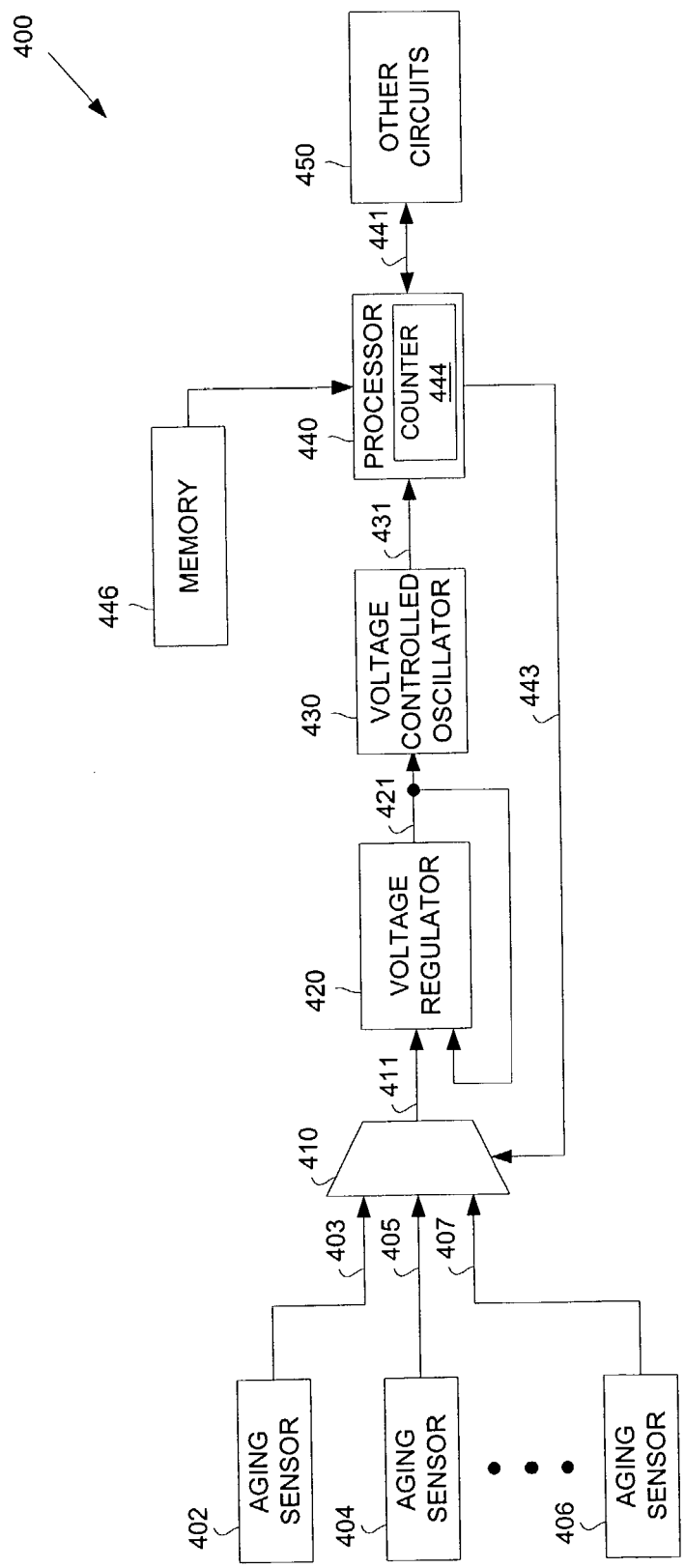
FIG. 4 shows a block diagram of an embedded aging sensor system in accordance with an embodiment of the present invention.

FIG. 4 shows a block diagram of an exemplary embedded IC aging sensor system (400) in accordance with an embodiment of the present invention. A plurality of aging sensors (402, 404, 406) output an analog signal on lines (403, 405, 407), respectively. Each aging sensor (402, 404, 406) operates with a different operating condition. For example, each aging sensor (402, 404, 406) may use a different bias voltage or oscillate at a different frequency or duty-cycle. Aging effects, for example, may affect the aging sensor's (402, 404, 406) response to the different bias voltages or may affect the frequency of oscillation or duty-cycle.

Dependent on another circuit (450) that is requesting a code representative of a particular operating condition, one of the analog signals on lines (403, 405, 407) is selected by an analog multiplexer (410). The analog multiplexer (410) outputs a multiplexer output on line (411) selected from the analog signals on lines (403, 405, 407). The multiplexer output on line (411) is input to a voltage regulator (420).

The voltage regulator (420) is a linear voltage regulator arranged to output a voltage potential is output on line (421) dependent on an input voltage potential of the multiplexer output on line (411). The output voltage potential on line (421) generated by the voltage regulator (420) is regulated using the output voltage potential on line (421) as a feedback signal. By incorporating the voltage regulator (420) into the embedded aging sensor system (400), the amount of noise present in an aging sensor measurement of an IC may be reduced. Further, because the voltage regulator (420) uses feedback to regulate the output voltage potential on line (421), the output voltage potential on line (421) for a given input voltage potential of the multiplexer output on line (411) may be maintained at a substantially constant value over a wide range of power supply variations.

The voltage regulator (420) connects to a voltage controlled oscillator (430) using line (421). The voltage controlled oscillator (430) generates an oscillating signal with a frequency dependent on an input voltage potential from line (421). The oscillating signal generated by the voltage controlled oscillator (430) on line (431) is input to a processor (440).

In an embodiment of the present invention, the processor (440) may use one or more counters (444) to count a number of oscillations generated by the voltage controlled oscillator (430) within a desired time or clock cycles. A value representing the number of oscillations from the voltage controlled oscillator (430) is used to indicate an operating characteristic of one of the aging sensors (402, 404, 406).

In an embodiment of the present invention, the processor (440) may use a memory (446). The memory (446) may store calibration information. Accordingly, the processor (440) may indicate with a code a difference between an operating characteristic of one of the aging sensors (402, 404, 406) and calibration information stored in the memory (446).

In FIG. 4, other circuits (450), e.g., temperature sensors, a phase locked loop, a delay locked loop, a voltage regulator, a voltage generator, etc., may request that the embedded aging sensor system (400) indicate a code using line (441) representative of any aging effects. For example, the other circuit (450) may input a code to the processor (440) to indicate that any aging effects for a circuit using a 0.5 bias voltage potential is desired. The processor (440) may select one of the aging sensors (402, 404, 406) that monitors a closest matching bias voltage potential. Accordingly, a multiplexer output on line (411) is generated dependent on the processor (440) selecting one of the aging sensors (402, 404, 406).

The multiplexer output on line (411) is regulated by the voltage regulator (420) and converted to a signal on line (431) that oscillates at a frequency dependent on the multiplexer output on line (411). The processor (440) may use the counter (444) to count the number oscillations that occur over a specific time interval or number of clock cycles. The resulting count may be compared with calibration information stored in the memory (446) and any difference reported in a code output on line (441). The other circuit (450) may adjust circuit elements within or operatively connected to the other circuit (450) such that the other circuit (450) operates properly.

Figure 5:
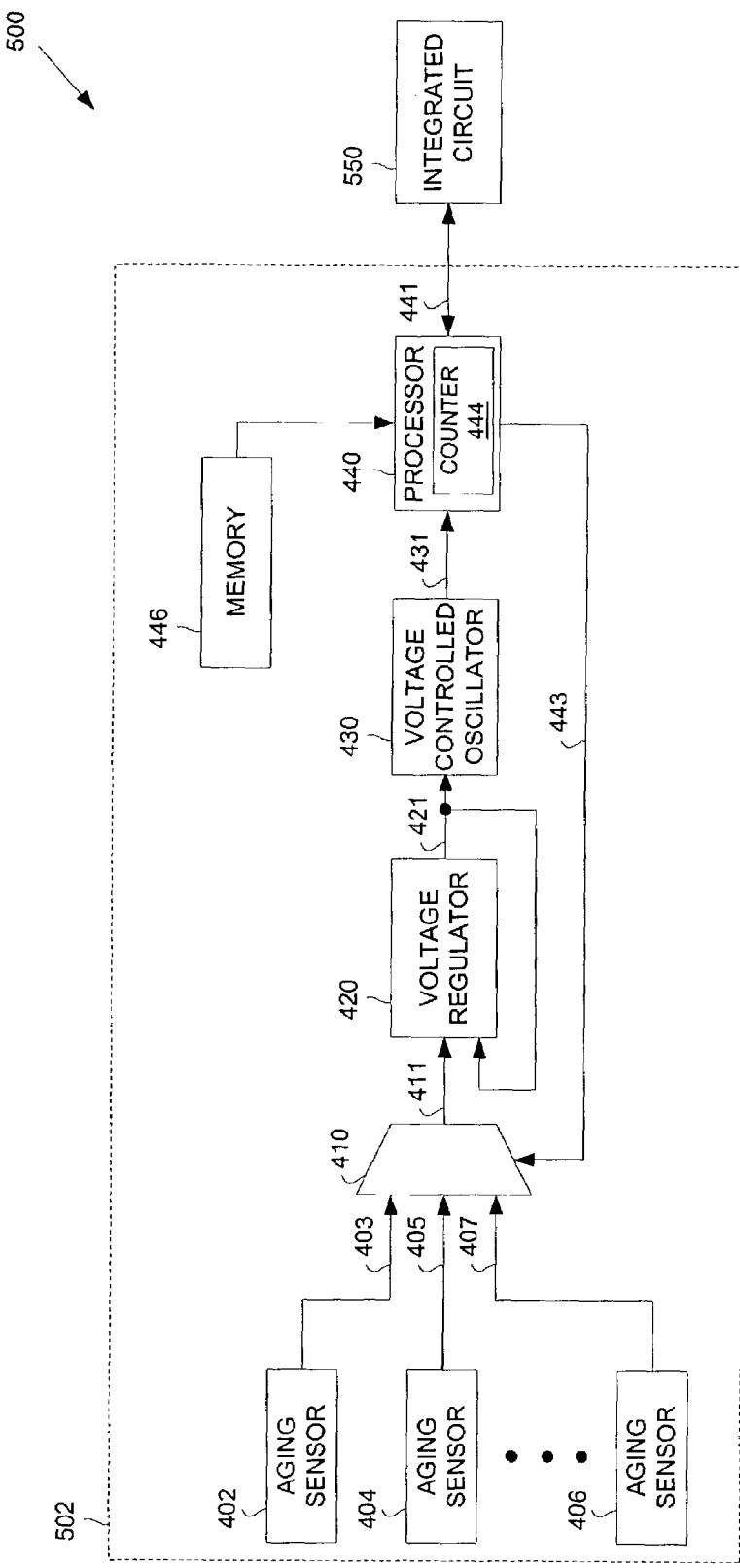
FIG. 5 shows a block diagram of an embedded aging sensor system in accordance with an embodiment of the present invention.

FIG. 5 shows a block diagram of an exemplary embedded aging sensor system (500) in accordance with an embodiment of the present invention. FIG. 5 operates similarly to FIG. 4; however, an integrated circuit (550) that is separate from integrated circuit (502) (representative of 400 in FIG. 4) requests and receives a code representative of aging information. The integrated circuit (550) may include other integrated circuits (not shown) used in normal operation, for example ICs (16 shown in FIG. 1), other integrated circuits (not shown) used in testing of the integrated circuit (502), and other integrated circuits (not shown) that may monitor integrated circuit (502) such as a service processor (not shown) or host processor (not shown).

Figure 6:
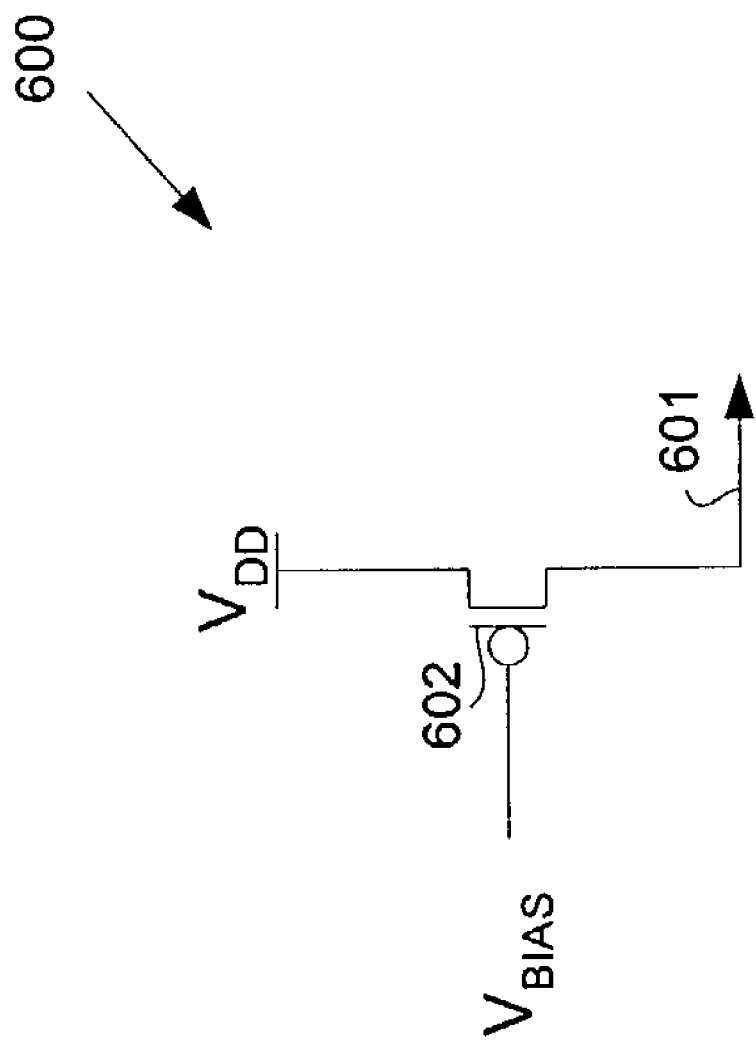
FIG. 6 shows a schematic diagram of an aging sensor in accordance with an embodiment of the present invention.

FIG. 6 shows a schematic diagram of an exemplary aging sensor (600) in accordance with an embodiment of the present invention. The aging sensor (600) includes a biased p-channel transistor (602). The bias voltage potential, $V_{BIAS}$, may vary depending on which aging sensor is accessed. Accordingly, a plurality of aging sensors provide information about operating characteristics under different bias voltage potentials. A source to drain current is output on line (601), and thus, a voltage potential may be determined from the source to drain current. Any aging effects that alter an operating characteristic of the biased p-channel transistor (602) may be indicated by a change in the source to drain current output on line (601).

Figure 7:
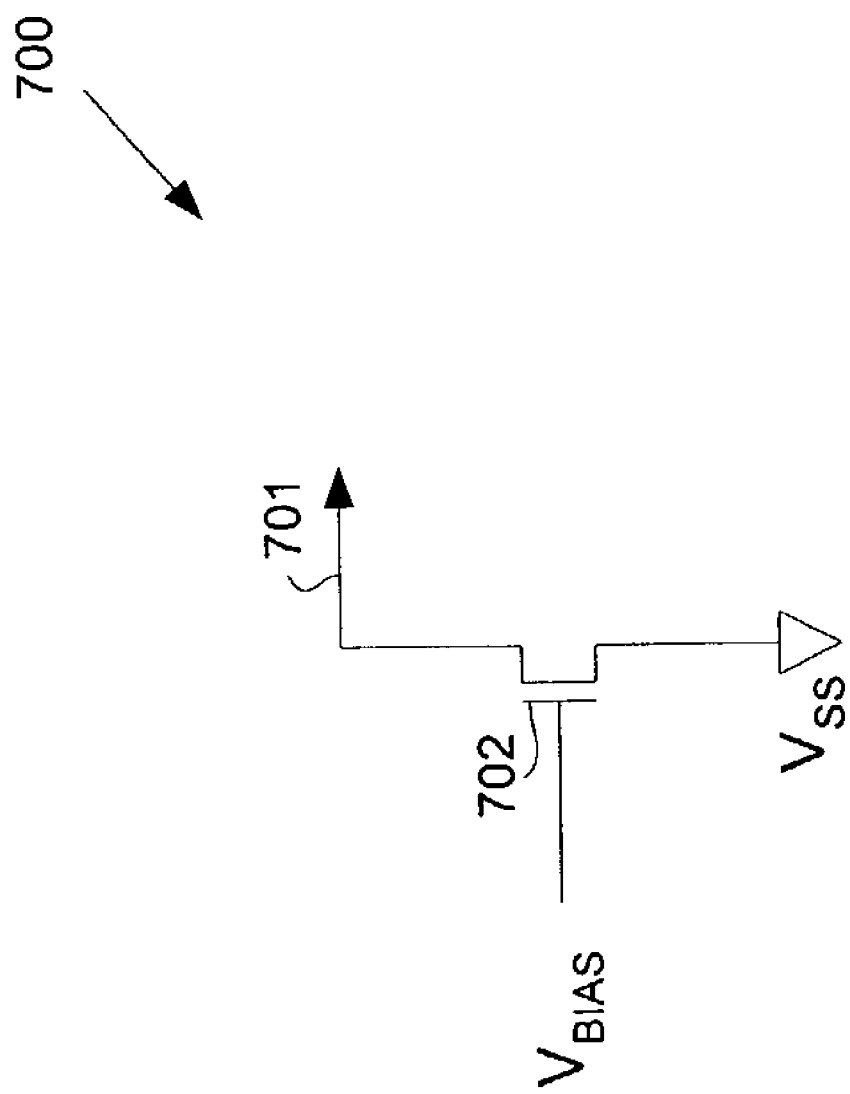
FIG. 7 shows a schematic diagram of an aging sensor in accordance with an embodiment of the present invention.

FIG. 7 shows a schematic diagram of an exemplary aging sensor (700) in accordance with an embodiment of the present invention. The aging sensor (700) includes a biased n-channel transistor (702). The bias voltage potential, $V_{BIAS}$, may vary depending on which aging sensor is accessed. Accordingly, a plurality of aging sensors provide information about operating characteristics under different bias voltage potentials. A source to drain current is output on line (701), and thus, a voltage potential may be determined from the source to drain current. Any aging effects that alter an operating characteristic of the biased n-channel transistor (702) may be indicated by a change in the source to drain current output on line (701).

Figure 8:
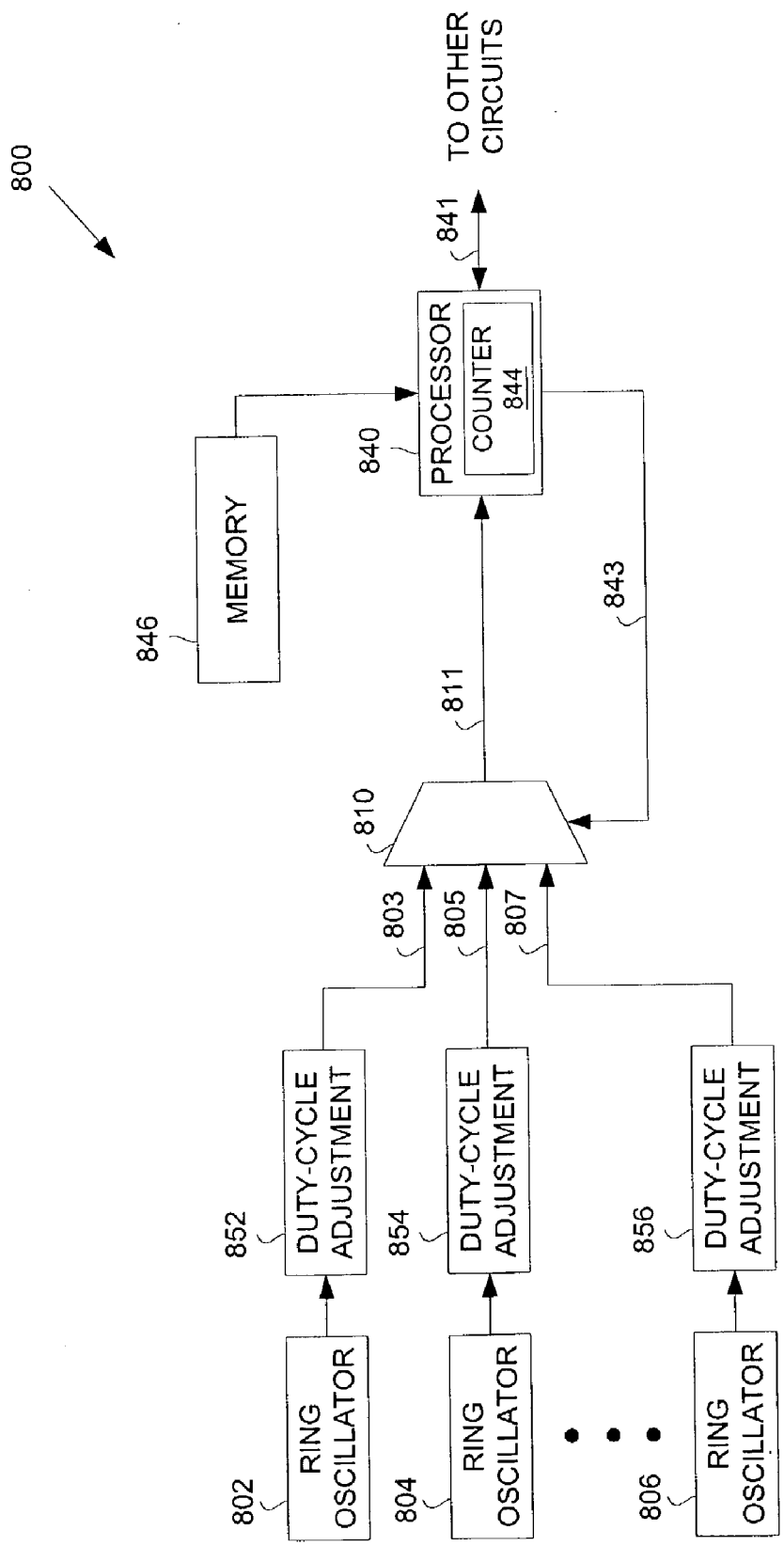
FIG. 8 shows a block diagram of an embedded aging sensor system in accordance with an embodiment of the present invention.

FIG. 8 shows a block diagram of an exemplary embedded aging sensor system (800) in accordance with an embodiment of the present invention. A plurality of ring oscillators (802, 804, 806) output digital signals to a plurality of duty-cycle adjustment circuits (852, 854, 856). In one embodiment, each ring oscillator (802, 804, 806) operates with a similar operating condition and/or number of circuit elements; therefore, the frequency of oscillation for each ring oscillator (802, 804, 806) is similar. The plurality of duty-cycle adjustment circuits (852, 854, 856) alters the duty-cycle of each of the plurality of ring oscillators (802, 804, 806). For example, duty-cycle adjustment circuit (852)

may pulse high every third cycle, whereas duty-cycle adjustment circuit (854) may pulse high every fourth cycle. As explained above, aging effects may affect the duty-cycle.

Dependent on other circuits requesting a code representative of a particular operating condition, one of the duty-cycle adjustment circuits' signals on lines (803, 805, 807) is selected by a digital multiplexer (810). The digital multiplexer (810) outputs a multiplexer output on line (811) selected from the duty-cycle adjustment circuits' signals on lines (803, 805, 807). The multiplexer output on line (811) is input to a processor (840).

In an embodiment of the present invention, the processor (840) may use one or more counters (844) to measure the duty-cycle generated by at least one of the duty-cycle adjustment circuits (852, 854, 856). A value representing the duty-cycle measured from the at least one duty-cycle adjustment circuits (852, 854, 856) is used to indicate an operating characteristic of the at least one of the duty-cycle adjustment circuits (852, 854, 856). A change in duty-cycle may be dependent on an aging effect.

In an embodiment of the present invention, the processor (840) may use a memory (846). The memory (846) may store calibration information. Accordingly, the processor (840) may indicate with a code a difference between an operating characteristic of one of the duty-cycle adjustment circuits (852, 854, 856) and calibration information stored in the memory (846).

In FIG. 8, digital circuits may request that the embedded aging sensor system (800) indicate a code using line (841) representative of any aging effects. For example, the digital circuits may input a code to the processor (840) to indicate that any aging effects for a circuit operating with a particular duty-cycle or frequency is desired. The processor (840) may select one of the duty-cycle adjustment circuits (852, 854, 856) that monitors a closest matching duty-cycle. Accordingly, a digital multiplexer output on line (811) is generated dependent on the processor (840) selecting one of the duty-cycle adjustment circuits (852, 854, 856).

The processor (840) may use the counter (844) to measure the duty-cycle. The resulting count may be compared with calibration information stored in the memory (846) and any difference reported in an code output on line (841). The other circuit may adjust circuit elements within or operatively connected to the other circuit such that the other circuit operates properly.

Advantages of the present invention may include one or more of the following. In one of more embodiments, because an aging sensor system provides a code representative of an aging effect for a particular bias voltage potential, other circuits may adjust their operation in response to aging effects in order to continue to properly operate.

In one or more embodiments, because an aging sensor system includes a plurality of aging sensors a wide variety of aging effects under a plurality of different operating conditions may be observed and reported.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a first sensor disposed on the integrated circuit and arranged to generate a first output dependent on an aging effect of a first element within the first sensor;
   a processor operatively connected to the first sensor and arranged to indicate a code indicative of the aging effect; and
   a circuit, separate from the first sensor, operatively connected to the processor,
   wherein the code is usable to compensate for the aging effect of the circuit separate from the first sensor.

2. The integrated circuit of claim 1, further comprising:
   a second sensor disposed on the integrated circuit and arranged to generate a second output dependent on an aging effect of a second element within the second sensor; and
   a multiplexer operatively connected to the first sensor and the second sensor, wherein the multiplexer is arranged to select between at least the first output and the second output, and wherein the processor is arranged to indicate the code dependent on at least the first output and the second output.

3. The integrated circuit of claim 2, further comprising a voltage regulator operatively connected to the multiplexer and the processor.

4. The integrated circuit of claim 2, further comprising a voltage controlled oscillator operatively connected to the multiplexer and the processor.

5. The integrated circuit of claim 2, wherein the second sensor comprises a transistor biased at a voltage potential.

6. The integrated circuit of claim 2, wherein the multiplexer comprises an analog multiplexer.

7. The integrated circuit of claim 2, wherein the processor is arranged to select between the first output and the second output dependent on another circuit that requests the code.

8. The integrated circuit of claim 1, further comprising a memory operatively connected to the processor.

9. The integrated circuit of claim 1, wherein the processor comprises a counter.

10. The integrated circuit of claim 1, wherein the processor is operatively connected to at least one other circuit disposed on the integrated circuit.

11. The integrated circuit of claim 1, wherein the first sensor comprises a transistor biased at a voltage potential.

12. The integrated circuit of claim 1, wherein the first sensor comprises a ring oscillator and a duty-cycle adjustment circuit.

13. A method for determining an aging effect on an integrated circuit, comprising:
   generating a first output dependent on an aging effect of a first element;
   indicating a code dependent on generating, wherein the code is indicative of the aging effect; and
   using the code to compensate for the aging effect of a circuit separate from the first element.

14. The method of claim 13, wherein generating the first output is dependent on a source to drain current of a first transistor biased at a first voltage potential.

15. The method of claim 13, wherein generating further comprising generating a second output dependent on a condition of a second element.

16. The method of claim 15, wherein generating the second output is dependent on a source to drain current of a second transistor biased at a second voltage potential.

17. The method of claim 15, further comprising selecting from at least the first output and the second output to produce a multiplexer output.

18. The method of claim 17, further comprising regulating a voltage potential of the multiplexer output.

19. The method of claim 17, further comprising generating a signal that oscillates at a frequency dependent on the multiplexer output.

20. The method of claim 13, wherein indicating is further dependent on stored information.

21. The method of claim 13, further comprising transferring the code to at least one other circuit disposed on the integrated circuit.

22. The method of claim 13, wherein indicating the code is dependent on measuring a duty-cycle.

23. An integrated circuit, comprising:
   means for generating an output dependent on an aging effect of an element;
   means for indicating a code dependent on the output, wherein the code is indicative of the aging effect; and
   means for compensating for the aging effect of a circuit separate from the element dependent on the code.

24. The integrated circuit of claim 23, further comprising means for generating a signal whose duty-cycle is dependent on the output.

25. The integrated circuit of claim 23, further comprising means for generating a signal whose frequency is dependent on the output.

* * * * *